United States Patent
Muris

[19]

[11] Patent Number: 5,978,945
[45] Date of Patent: Nov. 2, 1999

[54] TESTER ARRANGEMENT COMPRISING A CONNECTION MODULE FOR TESTING, BY WAY OF THE BOUNDARY SCAN TEST METHOD, A CARRIER PROVIDED WITH A FIRST NUMBER OF DIGITAL ICS WITH BST LOGIC AND A SECOND NUMBER OF DIGITAL ICS WITHOUT BST LOGIC

[75] Inventor: Mathias N. M. Muris, Eindhoven, Netherlands

[73] Assignee: U.S. Philips Corporation, New York, N.Y.

[21] Appl. No.: 08/249,427

[22] Filed: May 26, 1994

[30] Foreign Application Priority Data

Oct. 15, 1993 [EP] European Pat. Off. .............. 93202924

[51] Int. Cl.⁶ .................................................. G01R 31/38
[52] U.S. Cl. ............................................ 714/727; 714/733
[58] Field of Search ..................................... 714/727, 726, 714/724, 729, 733, 734

[56] References Cited

U.S. PATENT DOCUMENTS 5,331,274  7/1994  Jarwala et al. ......................... 371/22.3
5,377,199  12/1994 Fandrich ................................. 371/22.3
5,404,358  4/1995  Russell .................................... 371/22.3
5,428,624  6/1995  Blair et al. .............................. 371/22.3

OTHER PUBLICATIONS

Bleeker, "Pumping out the vectors", Test Magazine, Sep. 1993, pp. 9–10.

"Boundary–Scan Test—A Practical Approach", by H. Bleeker et al, Kluwer 1993, pp. 157,166.

*Primary Examiner*—Hoa T. Nguyen
*Attorney, Agent, or Firm*—Anne E. Barschall

[57] ABSTRACT

The invention relates to an arrangement for testing, by way of the Boundary Scan Test method, carriers on which there are provided a number of ICs with BST logic and a number of ICs without BST logic. The arrangement comprises a connection module enabling the testing of such carriers also when the ICs without BST logic are fast in comparison with the neighboring BST logic.

16 Claims, 6 Drawing Sheets

TESTER ARRANGEMENT COMPRISING A CONNECTION MODULE FOR TESTING, BY WAY OF THE BOUNDARY SCAN TEST METHOD, A CARRIER PROVIDED WITH A FIRST NUMBER OF DIGITAL ICS WITH BST LOGIC AND A SECOND NUMBER OF DIGITAL ICS WITHOUT BST LOGIC

BACKGROUND OF THE INVENTION

The invention relates to an arrangement comprising a connection module for boundary scan testing ("BST") of a carrier on which digital ICs are arranged. A number of ICs are provided with BST test logic and a number of ICs are not provided with BST test logic.

The BST method is described in "Boundary-Scan Test, A Practical Approach", Harry Bleeker, Peter van den Eijnden and Frans de Jong, Kluwer, Boston, 1993, ISBN 0-7923-9296-5. Pages 157 to 166 describe the testing of carriers, on which a number of ICs are provided with BST test logic.

Contemporary carriers often comprise a number of ICs with BST test logic and a number of ICs without BST test logic. The interconnections or interconnections to the latter ICs can be tested by controlling these ICs from neighbouring ICs that are provided with BST logic.

The interconnection function is for example to be understood as:
a. the conductor pattern provided on the carrier;
b. the connection between this pattern and the pins of the ICs;
c. the connection between these pins and the bond pads provided on the substrate of the IC.

It is a drawback that this method of controlling and testing the ICs by means of the neighbouring ICs is comparatively slow. This is due to the fact that the test signals reach the non-BST ICs to be tested via a chain of registers. Slow testing has as a consequence that, for example in the case of DRAMs, the interval between two consecutive cycles is too long.

SUMMARY OF THE INVENTION

It is inter alia an object of the invention to render the method of testing the interconnections, with ICs that do not have their own BST logic, suitable for fast ICs, while still using neighboring ICs for control.

To this end, according to one of the aspects of the invention, a test arrangement according to the invention comprises a connection module. The module comprises one or more test ICs which are connected to external test pins of the module. The connection module also is for testing a carrier, according to the Boundary Scan Test method. The carrier carries object ICs. A first number of the object ICs are provided with BST logic. A second number of the objects ICs are not provided with BST logic. Fast object ICs belonging to the second number can be controlled as follows. Test ICs in the connection module are provided with BST logic, including an instruction register, TAP controller, boundary scan register, BST test pins, and data pins. The BST logic is included in a BST chain the test ICs are controlled by the tester via said BST chain. At least one test IC generates RAS (Row Address Strobe) and CAS (Column Address Strobe) pulses for the carrier to be tested, under the control of a private instruction shifted from the BST chain into the instruction register. The private instruction is synchronized by a state of the TAP controller. A number of the external test pins serve to transfer a RAS and CAS protocol, generated by a test IC, to the carrier to be tested. These external pins are referred to as RAS and CAS pins.

In a first preferred embodiment, the signal behaviour of a RAS pin or a CAS pin is determined by a first code applied to the BST cell of the relevant pins by the tester. This offers the advantage that the behaviour of the pin can be dynamically influenced by the tester. An example in this respect is the deactivation of the pin for given tests.

In a second preferred embodiment, the variation in time of the signal of the RAS and CAS pins is functionally determined by a second code applied to the BST cells of a number of other external pins by the tester. This offers the advantage that the object ICs to be tested can be fully controlled by the tester in conformity with given protocols.

BRIEF DESCRIPTION OF THE DRAWING

The invention will be described in detail hereinafter, by way of example, with reference to the accompanying Figures.

DETAILED DESCRIPTION OF THE PREFERRED EMBODIMENTS

Figure 1:
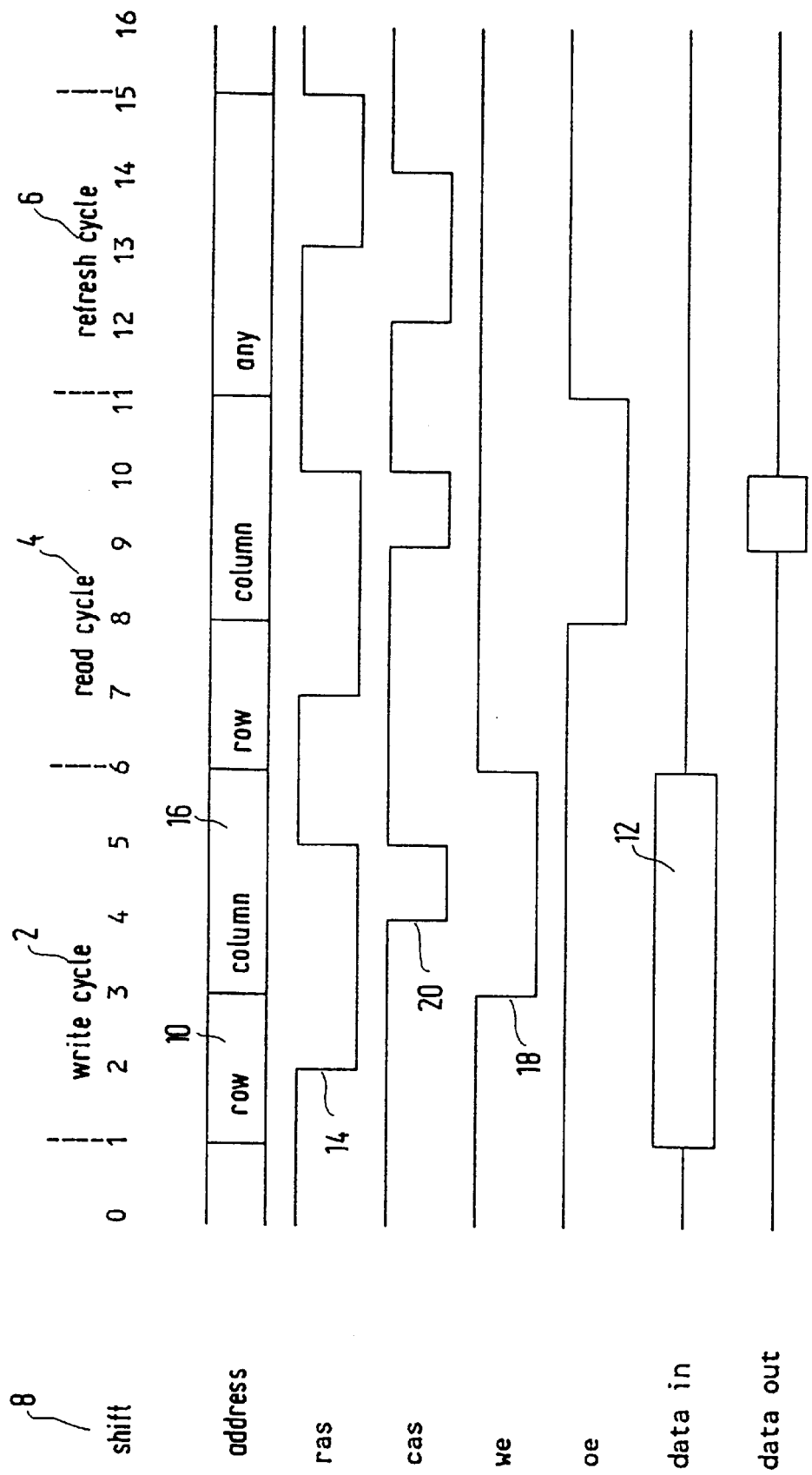
FIG. 1 is a timing diagram for test procedure for a memory IC when the connection module according to the invention is not used.

FIG. 1 is a timing diagram for the testing of the interconnection function of the object ICs 201 without BST logic. Such IC's will be referred to hereinafter as object ICs of the second type. This testing is by neighbouring object ICs (202) with BST logic, referred to hereinafter as object ICs of the first type. During such testing, test data is shifted through the BST chain to the BST cells of the pins of the object ICs of the first type and subsequently applied to the object ICs of the second type thereby using the interconnections to be tested.

FIG. 1, in which the second type of object IC is a dynamic memory, shows timing of an example of how the protocol for the test data is presented to the memory. There are different protocols for write (2), read (4) and refresh (6) operations on the memory. Each step in a protocol requires a complete shift (8) of the required pattern through the BST chain.

The strategy for testing the memory consists in writing a number into the memory and reading the number therefrom at a later stage for verification. The choice of the complete set of test patterns for testing the interconnection function with the memory is such that all possible stuck-at and bridging faults on and between the pins on the memory will result in a read value which is different from the situation where no faults are present on or between the pins. The steps for a write operation (2) into the memory require in detail:
shift operation 1 supplying pattern for row address (10) and already preparing data (12);
shift operation 2 supplying pattern to activate RAS (14);

shift operation 3 supplying pattern for column address (16) and already preparing the write enable (18);

shift operation 4 supplying pattern to activate CAS (20);

shift operation 5 data (12) is actually written into memory.

A read operation (4) in the memory also requires mutatis mutandis five shift operations through the BST chain. It can also be deduced from FIG. 1 that the execution of a single protocol for refreshing (6) the memory requires four shift operations.

The time required for shifting patterns in the BST chain is dependent on the number of BST cells in the BST chain and on the frequency of the tester. In an example with dynamic memories and a chain of 150 BST cells, it was determined that a. 10 MHz tester was not fast enough.

Figure 2:
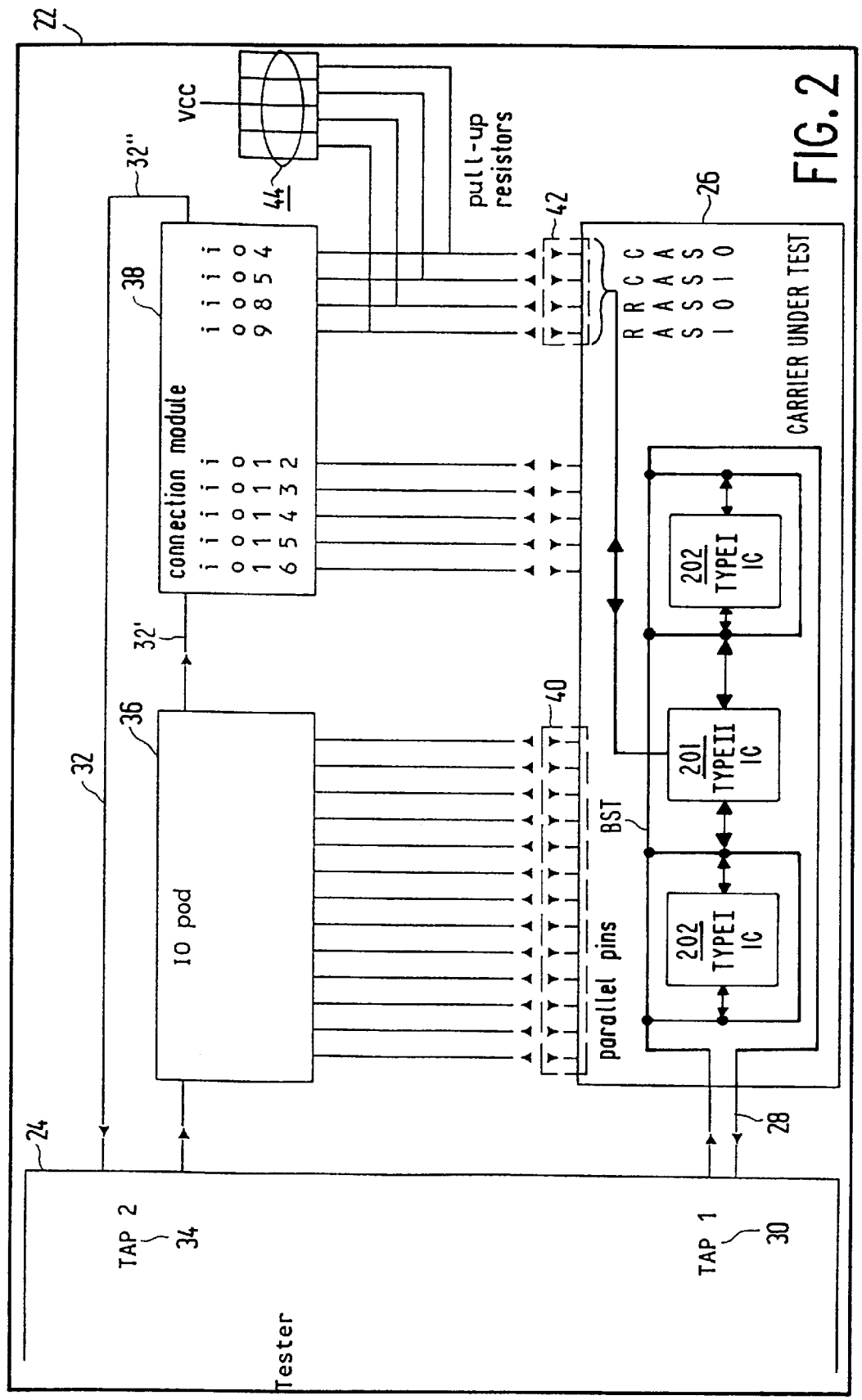
FIG. 2 shows a circuit arrangement in accordance with the invention as well as the interconnection of the tester, the connection module and the carrier to be tested.

FIG. 2 shows the arrangement (22) which includes a tester (24) whereto the carrier (26) to be tested is connected. The carrier (26) is connected, via a BST chain (28), to TAP 1 (30) of the tester (24) and, via a second BST chain (32, 32', 32), to TAP 2 (34). The second BST chain (32) pass through an IO pod (36) and the connection module (38). The IO pod (36) is usually considered to be an extension of the tester (24) and enables testing of a connector (40) of the carrier (26), thus offering also broader access to the carrier.

The connection module (38) is connected to the carrier (26) in such a manner that the module (38) can replace the original ICs (202) on the carrier (26) in sending the control signals RAS and CAS (42) via lines io4, io5, io8, and io9, and other control signals via lines to other object IC's of the first type. These original ICs use and control the memories in the normal operating condition of the carrier. The pull-up resistors (44) are not essential but provide a defined value of the control signals at the instant of switching over between original ICs and the module (38).

Figure 3:
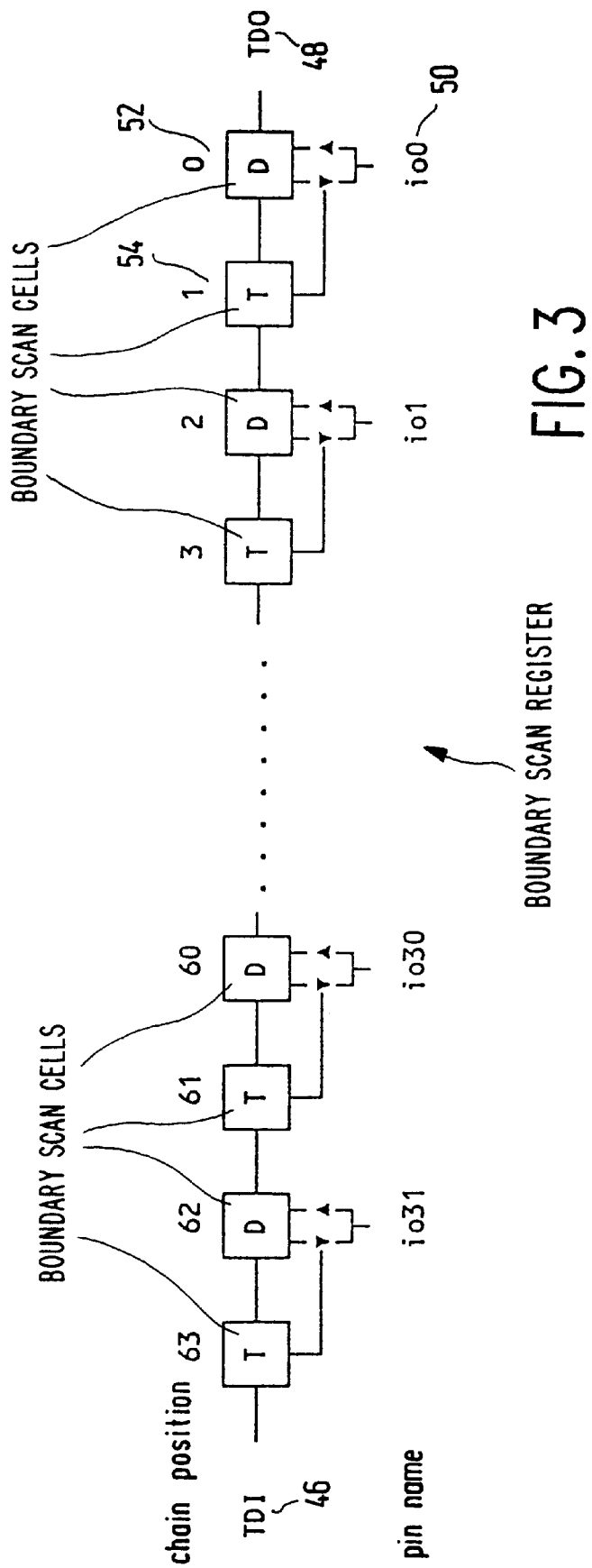
FIG. 3 shows how the boundary scan register in a test IC in the connection module is connected to the pins of the test IC.

FIG. 3 shows the BST register in a test IC of the connection module. The BST register is a chain of BST cells and extends from the TDI pin (46) of the test IC to the TDO pin (48) of the test IC. In the test IC the data pins can optionally operate as an input or as an output. Each data pin in the IC has two BST cells; for the pin io0 (50) this is a cell on the position 0 (52) and a cell on the position 1 (54).

A data BST cell (52) contains the desired bit for the relevant pin (50) when this pin operates as an output, and contains the observed bit when the pin (50) operates as an input. Furthermore, the control BST cell (54) can ensure that the relevant pin (50) is deactivated and no longer influences the environment. Such an inactive state is used when several sources can optionally control one receiver. In the present case this feature is used to let the control signals RAS and CAS be generated at option by the original ICs or by the connection module during a test.

Figure 4:
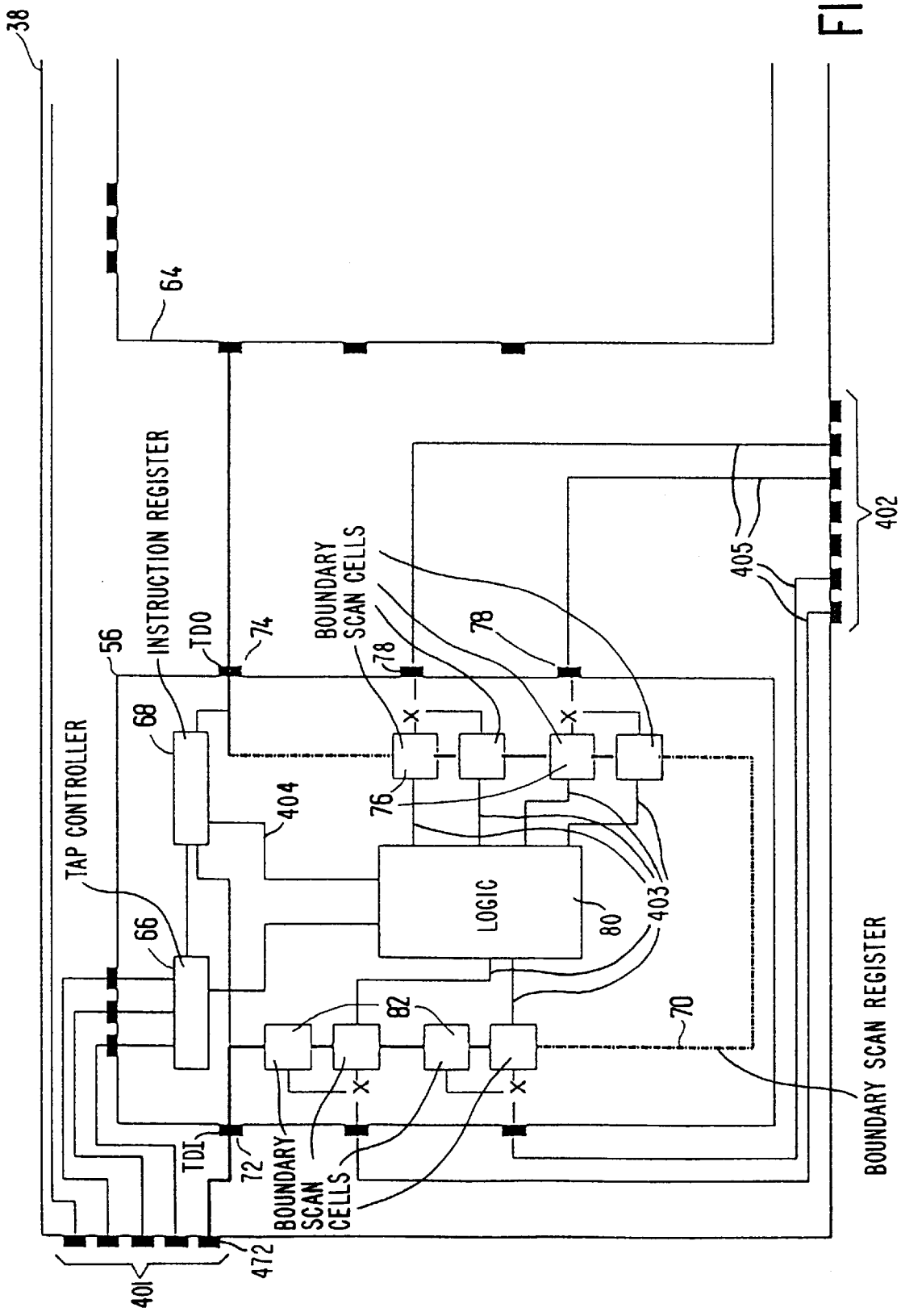
FIG. 4 is a detailed representation of a test IC and how it is connected to the pins of the connection module and a further test IC, if any.

FIG. 4 shows the internal construction of the test IC (56) in the connection module (38) and how the IC is connected to the external test pins (401) and external RAS and CAS pins (402) and to a further test IC (64), if any. The test IC (56) comprises a TAP, Test Access Port, controller (66) which controls the IC (56) in accordance with the BST standard. The behaviour of the IC (56) is determined by an instruction shifted into the instruction register (68) in combination with the state of the TAP controller (66).

The test IC also comprises a boundary scan register (70) which extends from the TDI pin (72) of the test IC to the TDO pin (74) of the test IC, the boundary scan register (70) being coupled with boundary scan chain (32) 32, 32". The boundary scan register comprises cells (76) for each data pin (78) whereby bits are supplied to or from the logic (80) of the test IC via connections (403).

The logic (80) determines RAS and CAS patterns for the relevant pins (78) on the basis of data shifted, via the BST chain (B2, 32', 32; into the BST cells (76 and 82) of some pins. The logic (80) is controlled by the instruction register (68); via a connection (404) and is triggered for the actual starting of the RAS and CAS patterns by a given state of the TAP controller (66). Connections (405) couple pins (78) to pins (402).

Figure 5:
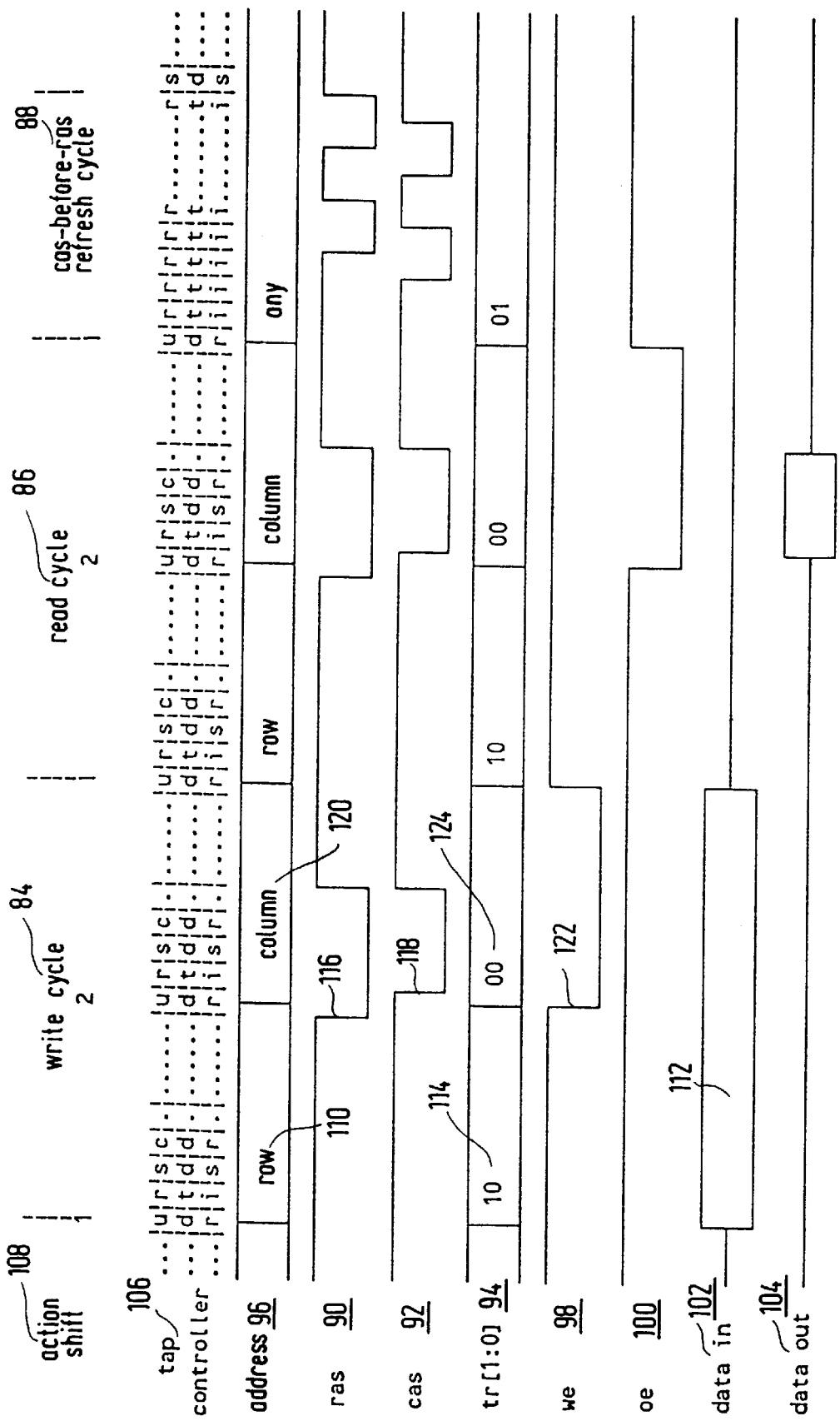
FIG. 5 is a timing diagram the test procedure for a memory IC, utilizing the connection module.

FIG. 5 illustrates the situation upon the testing of the interconnection function with the object ICs without BST test logic, referred to hereinafter as second type of object IC, by neighbouring object neighbouring ICs with BST test logic which are referred to hereinafter as first type of object IC. During this test the test data for the second type of object IC is shifted, via BST chain (28), to the BST cells of the pins of the first type of object IC; however, the signals which must be fast, in this case being the RAS and CAS pulses for a dynamic memory, are supplied by the connection module and not by the second type of object IC.

FIG. 5 shows the various signals for a write cycle (84), a read cycle (86) and a refresh cycle (88) of the memory. The signals concerning the test IC are:

RAS (90): the Row Address Strobe, triggering for the row addressing;

CAS (92): the Column Address Strobe, triggering for the column addressing;

tr[1:0] (94) code applied to the test IC in order to determine desired protocol.

The signals concerning the first type of IC are:

address (96): pattern with the address where data is to be placed in the memory;

we (98): write enable, switch for the memory which determines that data can be received;

oe (100): output enable, switch for memory which determines that data can be read;

data in (102): test data placed in the memory;

data out (104): data read from the memory.

The TAP controller line (106) shows the states of the TAP controllers of the ICs with BST logic involved in the test. These states are specified in the BST standard. The line (106) holds for the ICs included in the BST chain of the carrier as well as for the ICs included in the BST chain of the connection module, because the two chains are synchronized by the tester. The state udr, being Update Data Register in which ICs in both places receive values from the relevant boundary scan cells, is used to synchronize the RAS and CAS pulses with the other signals.

A write cycle (84) consists of two shift operations (108) in the BST chain. The first operation consists in applying the row address (110) and the data (112) of the memory and applying the protocol choice (114) to the test IC in order to indicate that a memory access cycle commences. This specific protocol means that the test IC supplies a RAS pulse (116) at the end of the first operation and a CAS pulse (118) briefly after the beginning of the second operation.

The second operation consists in applying the column address (120) and the write enable (122) for the memory and applying a waiting protocol (124) for the test IC. Immediately after termination of the RAS pulse the memory is actually filled and subsequently the first step of the next cycle is awaited. This may again be a write cycle or a read cycle or a refresh cycle.

The overall test approach is to execute a number of successive write operations to different addresses in the memory, followed by reading some or all of these addresses and checking whether the correct numbers have been read again. The number of successive write and read operations that may be performed is limited by the period within which the memory need be refreshed.

Figure 6:
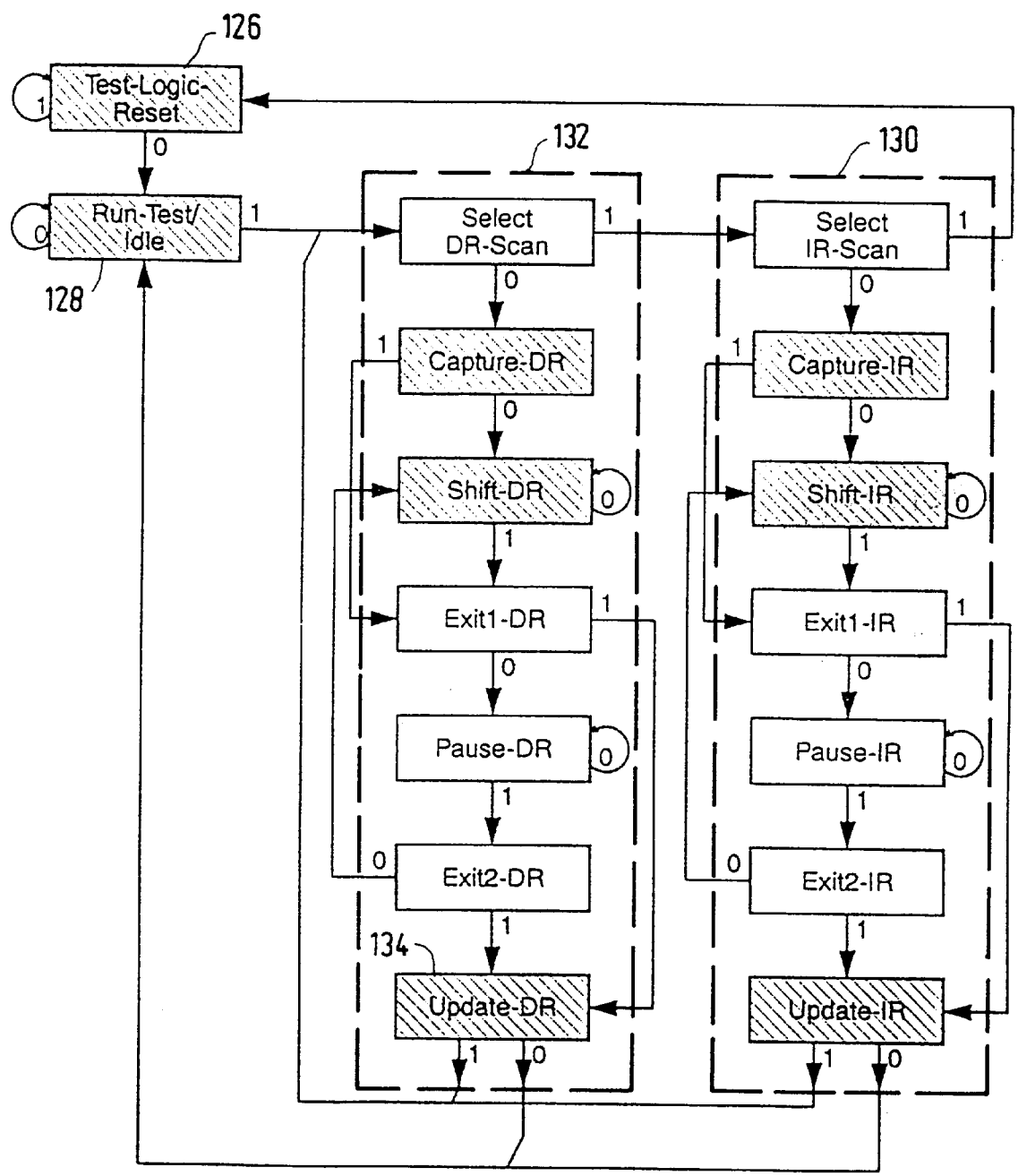
FIG. 6 shows the possible states of a TAP controller of an IC in conformity with the BST standard.

FIG. 6 shows the state diagram of the TAP controller (66) as specified in the BST standard. The state diagram contains the 16 possible states of the TAP controller which are denoted by rectangles. Furthermore, for each state arrows indicate the state that can be assumed next by the TAP controller. The arrow actually followed depends on the value of a signal presented, being the so-called Test Mode Select signal.

During normal operation of an IC provided with BST logic, i.e. all test logic being switched off and the IC executing its function, the TAP controller is in the state Test-Logic Reset (126). The IC is in the state Run-Test/Idle (128) when a test is actually being executed. There is also a group of states (130) where an instruction is placed in the instruction register (68) and a group of states (132) where data registers are read and filled.

The invention utilizes the fact that the outputs of the BST circuit will change value during the state Update-DR (134) of the TAP controller. The test IC is designed so that the generating of a RAS and CAS protocol is triggered by the entry into this state of the TAP controller.

I claim:

1. A test arrangement comprising
    a tester (24) for testing a carrier (26) that carries a first number of object IC'S (202) that have BST logic and carries a second number of object IC's (201) that do not have BST logic, at least one of the second number of object IC's being coupled to at least one of the first number of object IC's; and
    a connection module (38), which includes
        external leads (401, 402, 32', 32", RAS1, RAS0, CAS1, CAS0, 402), including
            BST test leads (32' 32", 401); and
            leads (RAS1, RAS0, CAS1, CAS0, 402) for transferring an RAS and/or CAS protocol in the form of RAS and CAS pulses to the second number of object IC's, the leads for transferring being referred to as RAS and CAS leads;
        BST logic (68, 66, 82, 70, 76, 80), connected to the BST leads, including
            an instruction register (68);
            a TAP controller (66); and
            a boundary scan register (82, 70, 76); and
        at least one logic element (80), controlled by the tester via said BST leads, the at least one logic element being for generating the RAS and CAS pulses for the carrier, under control of a private instruction shifted from the BST leads into the instruction register and synchronized by a state of the TAP controller,
    wherein at least one of the second number and/or an interconnection function to such at least one of the second number can be tested responsive to
        the at least one of the first number under control of the BST logic of the at least one of the first number; and
        the RAS and/or CAS protocol from the connection module.

2. An arrangement as claimed in claim 1, characterized in that at least one BST cell are provided for a RAS lead and a CAS lead which can contain a first code which is placed thereto by the tester, and which determines, after being decoded, the signal behaviour of the RAS lead and the CAS lead.

3. An arrangement as claimed in claim 2, characterized in that the choice of the protocol for the RAS and CAS leads is determined by a second code applied to BST cells of a number of other external leads by the tester.

4. (twice amended)An arrangement as claimed in claim 3, characterized in that there are at least four protocols for RAS and CAS leads, including:
    hold mode;
    CAS before RAS refresh;
    memory access cycle;
    RAS only refresh (CAS dummy).

5. The method as claimed in claim 3, characterized that the protocol for the RAS and CAS signals is one of:
    hold mode;
    CAS before RAS refresh;
    memory access cycle;
    RAS only refresh, CAS dummy.

6. An arrangement as claimed in claim 1, characterized in that the first and second number of object IC's and the logic element are physically integrated on the same substrate.

7. A method for testing object IC's on a carrier, which carrier carries IC's of a first type which have BST logic and IC's of a second type which do not have BST logic, at least one of the second type being coupled to at least one of the first type, the method comprising the steps of:
    supplying signals from a tester to a connection module and to the carrier;
    within the connection module, shifting the signals from the tester through a boundary scan register to create shifted signals;
    under control of the shifted signals, providing RAS and/or CAS signals from the connection module to the second type of IC, which second type is faster than the first type; and
    testing the at least one of the second type of IC responsive to
        the at least one IC of the first type, the at least one of the first type operating under control of the BST logic of the at least one of the first type, and
        the RAS and/or CAS signals from the connection module.

8. The method of claim 7 wherein the connection module (38) comprises at least one BST cell (82, 76) for an RAS lead (402) and/or a CAS lead (402) of the connection module, which cell can contain a first code which is placed therein by the tester, which code determines, after being decoded, the signal behaviour of the RAS lead and/or the CAS lead.

9. The method of claim 8, further comprising
    receiving a second code from the tester, the second code being received in at least one other BST cell, which other BST cell is coupled with at least one other external lead of the connection module; and
    determining a choice of a protocol for the RAS and CAS signals in response to the second code.

10. The method of claim 7 wherein the connection module and the IC's of the first and second type are all integrated onto a common substrate.

11. Apparatus for use in a connection module (36), the connection module being for use in conjunction with a tester (24) and a carrier under test (26), the apparatus comprising
    first connection means (403) for coupling to external leads of the connection module via a boundary scan chain (82, 76, 72, 472, 74, 32, 32', 32");
    second connection means (404) for connecting to an instruction register (68) of BST logic of the connection module;
    third connection means (405) for supplying RAS and CAS signals to RAS and/or CAS leads 402 of the connection module;

means (80) for, in response to signals received via the first and second connection means, generating RAS and CAS signals on the third connection means, for supply to a fast object IC (201) on the carrier, which fast object IC lacks BST logic, but is co-disposed on the carrier (26) with and coupled to another object IC (202) that has respective BST logic;

so that the fast object IC and/or an interconnection function of the fast object IC is testable responsive to the RAS and CAS signals on the third connection means; and the other object IC, operating under control of the respective BST logic.

12. A connection module (38) comprising external leads, including

BST test leads (32', 32");

leads for transferring an RAS and CAS protocol, referred to as RAS and CAS leads (RAS1, RAS0, CAS1, CAS0);

a test IC (56) including

BST logic (68, 66, 82, 70, 76) including the instruction register (68);

a TAP controller (66);

the boundary scan register (82, 70, 76);

the apparatus as claimed in claim 11.

13. The module of claim 12 wherein at least one BST cell (82, 76) is provided for an RAS lead (RAS1, RAS0) or a CAS lead (CAS1, CAS0) of the connection module, which cells can contain a first code which is placed therein by a tester, which code determines, after being decoded, the signal behaviour of the RAS lead or the CAS lead.

14. The module of claim 13, further comprising at least one other BST cell for coupling to at least one other external lead of the connection module and receiving a second code from a tester via the at least one other external lead; and wherein the logic element determines a protocol for the RAS and CAS leads in response to the second code.

15. The module as claimed in claim 14, characterized that the protocol for the RAS and CAS leads is one of:

hold mode;

CAS before RAS refresh;

memory access cycle;

RAS only refresh, CAS dummy.

16. A semiconductor substrate comprising first means for accommodating a connection module;

the connection module, including

BST logic;

at least one logic element;

second means for accommodating a plurality of testable IC's, the testable IC's, including at least one first type of IC that has BST logic and at least one second type of IC that does not have BST logic, the second type of IC being faster than and coupled to the first type of IC;

connection means for supplying:

test signals from an external tester to the BST logic in the connection module and the BST logic in the first type of IC;

RAS and/or CAS signals from the logic element to the second type of IC in a timely manner so that the second type of IC and/or an interconnection function of the second type is testable responsive to the RAS and/or CAS signals from the logic element; and the at least one first type of IC acting under control of the BST logic of the at least one first type of IC.

* * * * *